(12) United States Patent
Anderson et al.

(10) Patent No.: US 12,400,960 B2
(45) Date of Patent: Aug. 26, 2025

(54) VERTICAL-TRANSPORT FIELD-EFFECT TRANSISTOR WITH BACKSIDE GATE CONTACT

(71) Applicant: International Business Machines Corporation, Armonk, NY (US)

(72) Inventors: Brent A. Anderson, Jericho, VT (US); Albert M. Chu, Nashua, NH (US); Ruilong Xie, Niskayuna, NY (US); Nicholas Anthony Lanzillo, Wynantskill, NY (US); Lawrence A. Clevenger, Saratoga Springs, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 461 days.

(21) Appl. No.: 17/936,202

(22) Filed: Sep. 28, 2022

(65) Prior Publication Data

US 2024/0105610 A1    Mar. 28, 2024

(51) Int. Cl.
| | |
|---|---|
| *H01L 23/52* | (2006.01) |
| *H01L 23/528* | (2006.01) |
| *H10D 30/63* | (2025.01) |
| *H10D 64/23* | (2025.01) |

(52) U.S. Cl.
CPC ......... *H01L 23/5286* (2013.01); *H10D 30/63* (2025.01); *H10D 64/252* (2025.01)

(58) Field of Classification Search
CPC .. H01L 23/5286; H10D 30/63; H10D 64/252; H10D 84/83; H10D 84/0149; H10D 84/016; H10D 84/038

USPC .......................................................... 257/329
See application file for complete search history.

(56) References Cited

U.S. PATENT DOCUMENTS

| | | | |
|---|---|---|---|
| 10,629,538 B2* | 4/2020 | Zhang | .................. H10D 64/252 |
| 10,950,722 B2 | 3/2021 | Zhang | |
| 10,985,064 B2 | 4/2021 | Zhang | |
| 11,011,409 B2 | 5/2021 | Hellmund | |
| 11,031,296 B2 | 6/2021 | Anderson | |
| 11,101,318 B2 | 8/2021 | Kumar | |
| 11,121,086 B2 | 9/2021 | Hiblot | |
| 11,139,296 B2 | 10/2021 | Sharma et al. | |
| 2015/0370947 A1* | 12/2015 | Moroz | ............... H10D 30/6735 |
| | | | 716/119 |
| 2020/0144260 A1* | 5/2020 | Do | ..................... H10D 84/0195 |
| 2020/0144418 A1* | 5/2020 | Do | ..................... H01L 23/5226 |
| 2020/0295146 A1* | 9/2020 | Do | ..................... H10D 84/0195 |

(Continued)

FOREIGN PATENT DOCUMENTS

WO    2018044479 A1    3/2018

OTHER PUBLICATIONS

International Search Report and Written Opinion dated Dec. 13, 2023 from International Application No. PCT/IB2023/058768 filed Sep. 5, 2023.

*Primary Examiner* — Mohammad M Hoque
(74) *Attorney, Agent, or Firm* — Aaron N. Pontikos

(57) ABSTRACT

A VTFET is on a wafer and a backside power delivery network is on a backside of the wafer. A first backside contact is connected to a gate of the VTFET and a first portion of the backside power delivery network. The VTFET has a first width and the first width is a contacted poly pitch (CPP). The first backside contact may be at least the first width from the VTFET. The first backside contact may be double the first width from the VTFET.

20 Claims, 6 Drawing Sheets

(56) References Cited

U.S. PATENT DOCUMENTS

| | | |
|---|---|---|
| 2021/0082902 A1 | 3/2021 | Sobue |
| 2021/0242202 A1 | 8/2021 | Do et al. |
| 2021/0358848 A1 | 11/2021 | Wu |
| 2022/0045167 A1* | 2/2022 | Do ................. H10D 62/127 |
| 2022/0223514 A1* | 7/2022 | Sisodia ............ H01L 23/5226 |
| 2023/0163073 A1* | 5/2023 | Son .................. H01L 23/535 |
| | | 257/213 |
| 2023/0290779 A1* | 9/2023 | Do .................. H10D 84/0149 |
| 2024/0006531 A1* | 1/2024 | Sharma ............ H10D 30/6735 |

* cited by examiner

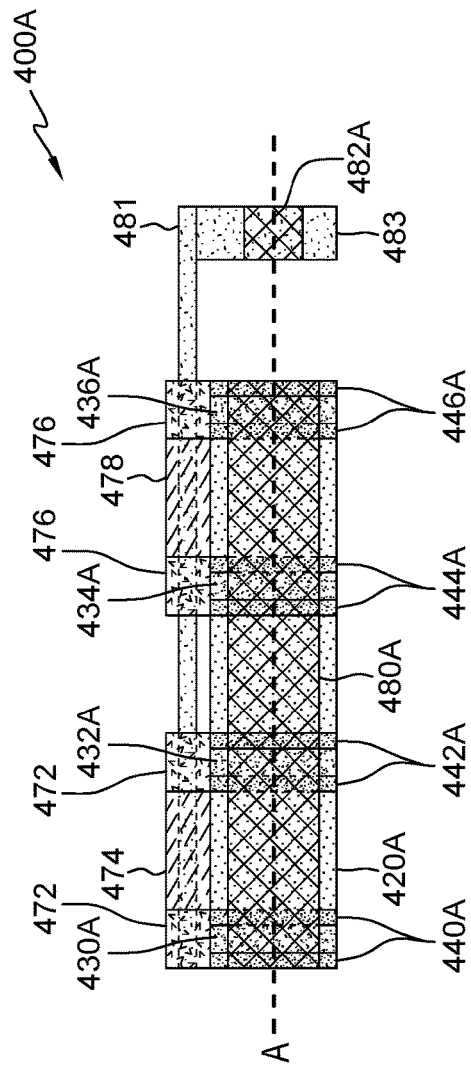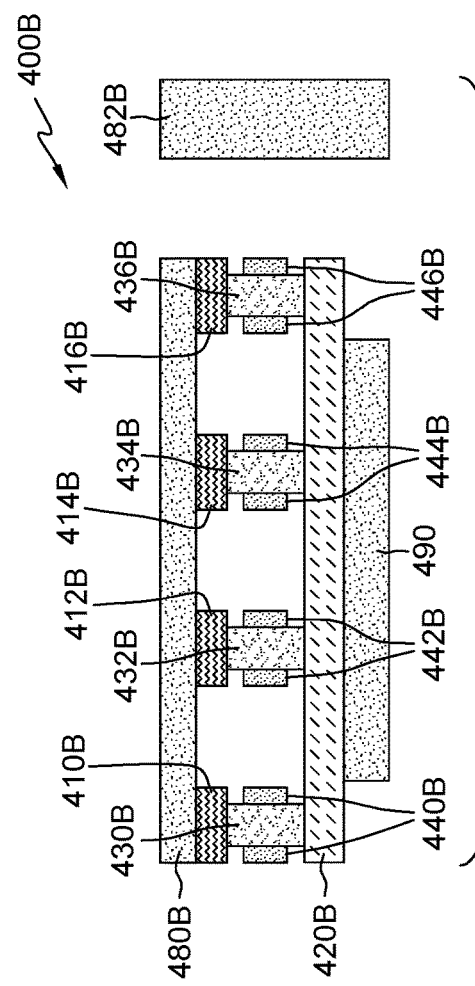

VERTICAL-TRANSPORT FIELD-EFFECT TRANSISTOR WITH BACKSIDE GATE CONTACT

BACKGROUND OF THE INVENTION

The present invention relates generally to the field of semiconductor device manufacture and more particularly to vertical-transport field-effect transistors (VTFET) with a gate connected to a backside power delivery network.

Semiconductor devices are fabricated by sequentially depositing insulating (dielectric) layers, conductive layers, and semiconductor layers of material over a semiconductor substrate, and patterning the various layers using lithography to form circuit components and elements thereon. Generally, these semiconductor devices include a plurality of circuits which form an integrated circuit (IC) fabricated on a semiconductor substrate.

Backside power delivery networks are an emerging technology to provide power delivery to circuitry on a wafer. The backside power delivery network is formed on a backside of the wafer as opposed to the frontside of the wafer where circuitry and wiring are traditionally formed. A challenge to backside power delivery is connecting to contacts in circuitry on the frontside of the wafer due to the backside power delivery network needing to cross the device layer in order to connect to contacts on the frontside of the circuitry.

VTFET devices allow for the flow of current vertically, from a bottom source/drain region to a top source/drain region. In a VTFET device, a bottom source/drain region is located closest to the wafer, a gate region is on top of the bottom source/drain region and a top source/drain region is on top of the gate region. The bottom source/drain region is located closest to the wafer the circuit is formed upon and the top source/drain region is located farthest from the wafer the circuit is formed upon. The gate region has a contact that is routed to the frontside of the device, thus, there is a need to contact the backside power delivery network by the gate region.

SUMMARY

In a first embodiment, a VTFET is on a wafer and a backside power delivery network is on a backside of the wafer. In the first embodiment, a first backside contact is connected to a gate of the VTFET and a first portion of the backside power delivery network. In the first embodiment, the VTFET has a first width and the first width is a contacted poly pitch (CPP). In the first embodiment, the first backside contact may be at least the first width from the VTFET. In the first embodiment, the first backside contact may be double the first width from the VTFET.

In the first embodiment, the backside power delivery network is selected from the group consisting of a clock signal and an input signal. In the first embodiment, a height of the first backside contact is a cell height of the VTFET. In the first embodiment, a frontside contact is connected to a top source/drain region of the VTFET and a frontside wiring. In the first embodiment, the frontside wiring is selected from the group consisting of local clock signal and an external input signal.

Embodiments of the present invention provide for any number of signals (e.g., clock, buss, I/O, power, ground, etc.) to be distributed or delivered to source/drain/gate regions of VTFET through a backside power delivery network. Embodiments of the present invention provide for area efficiency by providing a single CPP to drive many gate regions of multiple devices with low resistance. Embodiments of the present invention provide for a full cell height contact that reduces resistance from the backside to frontside contact or vice versa.

In a second embodiment, a plurality of VTFET are on a wafer. In the second embodiment, a backside power delivery network on a backside of the wafer. In the second embodiment, a first backside contact is connected to a gate of each VTFET of the plurality of VTFET and a first portion of the backside power delivery network.

In the second embodiment, each VTFET of the plurality of VTFET has a first width, and wherein the first width is a contacted poly pitch (CPP). In the second embodiment, the first backside contact may be at least the first width from a first VTFET of the plurality of VTFET. In the second embodiment, the first backside contact may be double the first width from a first VTFET of the plurality of VTFET. In the second embodiment, the first portion of the backside power delivery network is selected from the group consisting of a clock signal and an input signal. In the second embodiment, a height of the first backside contact is a cell height of a VTFET of the plurality of VTFET. In the second embodiment, a frontside contact is connected to a top source/drain region of the VTFET and a frontside wiring. In the second embodiment, the frontside wiring is selected from the group consisting of local clock signal and an external input signal.

Embodiments of the present invention provide for any number of signals (e.g., clock, buss, I/O, power, ground, etc.) to be distributed or delivered to source/drain/gate regions of VTFET through a backside power delivery network. Embodiments of the present invention provide for area efficiency by providing a single CPP to drive many gate regions of multiple devices with low resistance. Embodiments of the present invention provide for a full cell height contact that reduces resistance from the backside to frontside contact or vice versa. Embodiments of the present invention provide for the removal of an RX, or active area, layer to further reduce resistance.

In a third embodiment, a first plurality of vertical-transport field-effect transistor (VTFET) are in a first row on a wafer. In the third embodiment, a second plurality of VTFET are in a second row on the wafer and the first row is vertically adjacent to the second row. In the third embodiment, a backside power delivery network on a backside of the wafer. In the third embodiment, a first backside contact is between the first row and the second row. In the third embodiment, the first backside contact is connected to a gate of each VTFET of the first plurality of VTFET and a gate of each VTFET of the second plurality of VTFET. In the third embodiment, a second backside contact is connected the first backside contact and the backside power delivery network.

In the third embodiment, at least one VTFET of the first plurality of VTFET and second plurality of VTFET has a first width and the first width is a contacted poly pitch (CPP). In the third embodiment, a third plurality of VTFET are in the first row and between the first plurality of VTFET and the third plurality of VTFET is at least the first width. In the third embodiment, the first backside contact extends adjacent to the third plurality of VTFET and the first backside contact is connected to a gate of each VTFET of the third plurality of VTFET.

In the third embodiment, a fourth plurality of VTFET are in the second row and between the second plurality of VTFET and the fourth plurality of VTFET is at least the first width. In the third embodiment, the first backside contact extends adjacent to the fourth plurality of VTFET and the first backside contact is connected to a gate of each VTFET of the fourth plurality of VTFET. In the third embodiment, a height of the second backside contact is a height of a VTFET cell of the first plurality of VTFET and second plurality of VTFET. In the third embodiment, the backside power delivery network is selected from the group consisting of a clock signal and an input signal.

Embodiments of the present invention provide for any number of signals (e.g., clock, buss, I/O, power, ground, etc.) to be distributed or delivered to source/drain/gate regions of VTFET through a backside power delivery network. Embodiments of the present invention provide for area efficiency by providing a single CPP to drive many gate regions of multiple devices with low resistance. Embodiments of the present invention provide for a full cell height contact that reduces resistance from the backside to frontside contact or vice versa. Embodiments of the present invention provide for the removal of an RX, or active area, layer to further reduce resistance.

BRIEF DESCRIPTION OF THE DRAWINGS

The above and other aspects, features, and advantages of various embodiments of the present invention will be more apparent from the following description taken in conjunction with the accompanying drawings.

FIG. 4A depicts a top view of the semiconductor structure including four VTFET in parallel in accordance with a first embodiment of the present invention.

FIG. 4B depicts a cross-sectional view of section A of the semiconductor structure including four VTFET in parallel in accordance with a first embodiment of the present invention.

DETAILED DESCRIPTION

Figure 1:
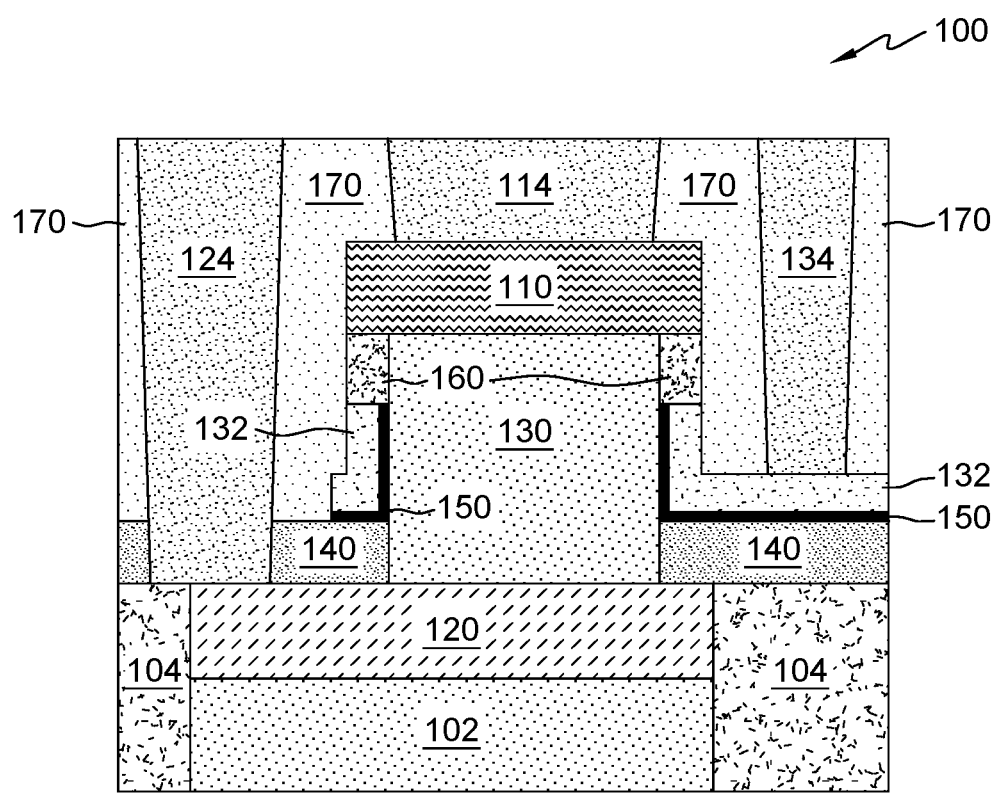
FIG. 1 depicts a cross-section view of a VTFET semiconductor structure with a frontside contact for the top source/drain region, bottom source/drain region, and gate region, in accordance with a first embodiment of the present invention.

Embodiments of the present invention recognize that vertical-transport field-effect transistors (VTFET) have vertical current flow. Embodiments of the present invention recognize that VTFET include a bottom source/drain region and a top source/drain region. Embodiments of the present invention recognize that the bottom source/drain region is closer to the backside of the VTFET (closer to the wafer) and that the top source/drain region is closer to the frontside of the VTFET (closer to the traditional interconnect wiring). Embodiments of the present invention recognize that an input will be to one source/drain region and the output will be to one source/drain region and therefore one of either the input or the output will be on the backside of the device and one of either the input or the output will be on the frontside of the device. Embodiments of the present invention recognize that a fin region is between the top source/drain region and bottom source/drain region and a gate region surround the fin region. Therefore, embodiments of the present invention recognize there is a need for a gate region to connect to the frontside and/or backside of the semiconductor device. Embodiments of the present invention recognize that in conventional VTFETs, the pitch (or width) between gates in adjacent devices in the same semiconductor layer is commonly known as a contacted gate pitch (CGP) or a contact poly pitch (CPP).

Embodiments of the present invention provide for any number of signals (e.g., clock, buss, I/O, power, ground, etc.) to be distributed or delivered to source/drain/gate regions of VTFET through a backside power delivery network. Embodiments of the present invention provide for area efficiency by providing a single CPP to drive many gate regions of multiple devices with low resistance. Embodiments of the present invention provide for a full cell height contact that reduces resistance from the backside to frontside contact or vice versa. Embodiments of the present invention provide for the removal of an RX, or active area, layer to further reduce resistance. Embodiments of the present invention provide for a frontside wiring connected to frontside contacts connected to a top source/drain region. Embodiments of the present invention provide for the frontside wiring to be selected from the group consisting of a local clock signal and an external input signal.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein. Reference will now be made in detail to the embodiments of the present invention, examples of which are illustrated in the accompanying drawings, wherein like reference numerals refer to like elements throughout.

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later. It is to be understood that aspects of the present invention will be described in terms of a given illustrative architecture; however, other architectures, structures, substrate materials, process features and steps can be varied within the scope of aspects of the present invention.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for advanced semiconductor devices, and only so much of the commonly practiced process steps are included as are necessary for an understanding of the described embodiments. The figures represent cross-section portions of a portion of an advanced semiconductor device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

For purposes of the description hereinafter, the terms "upper," "lower," "right," "left," "vertical," "horizontal," "top", "bottom," and derivatives thereof shall relate to the disclosed structures and methods, as oriented in the drawing figures. The terms "overlying," "atop," "over," "on "positioned on," or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

References in the specification to "one embodiment", "other embodiment", "another embodiment," "an embodiment," etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("ME"). In general, ME uses chemically reactive plasma to remove material deposited on wafers. High-energy ions from the ME plasma attack the wafer surface and react with the surface material(s) to remove the surface material(s).

Deposition processes for the metal liners and sacrificial materials include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

It should be noted, embodiments of the present invention, described below, are discussed in reference to semiconductor structure consisting of four VTFET in series. In alternative embodiments, the semiconductor structure may consist of any number of VTFET in any organization/layout of parallel and/or series. The Vertical transport field-effect transistors (VTFETs) have become viable device options for scaling semiconductor devices (e.g., complementary metal oxide semiconductor (CMOS) devices) to 5 nanometer (nm) node and beyond. VTFET devices include one or more fin channels with source/drain regions at ends of the fin channels on the top and bottom sides of the fins. Current flows through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FiN-FET-equivalent density at a larger contacted poly pitch (CPP), and providing lower middle-of-line (MOL) resistance.

Figure 2:
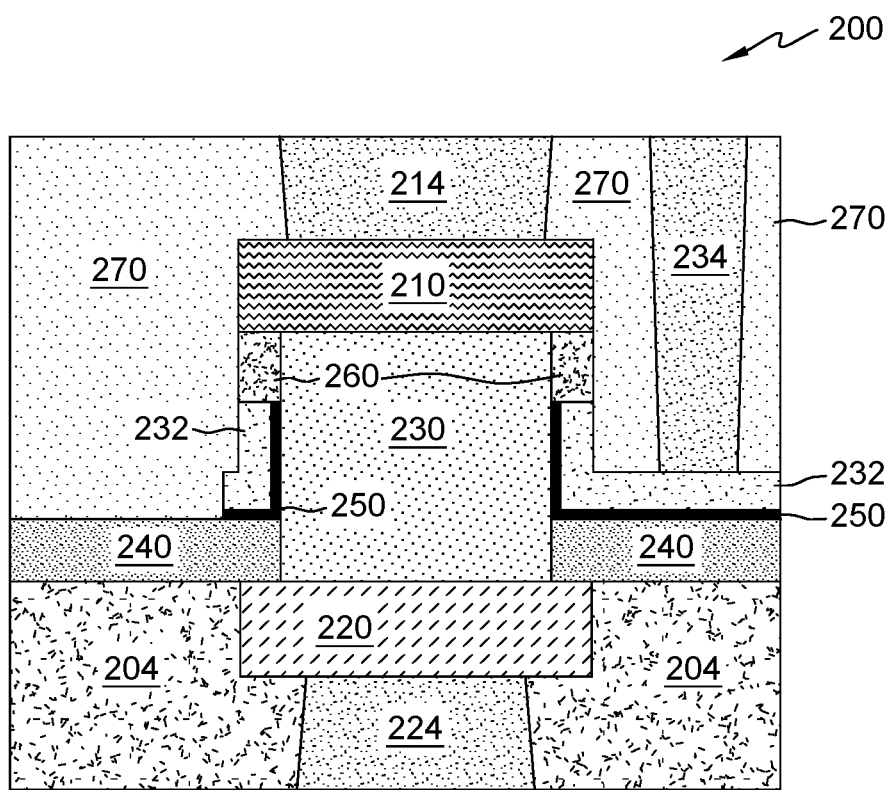
FIG. 2 depicts a cross-section view of a VTFET semiconductor structure with a frontside contact for the top source/drain region and gate region and a backside contact for the bottom source/drain region, in accordance with a first embodiment of the present invention.
Figure 3:
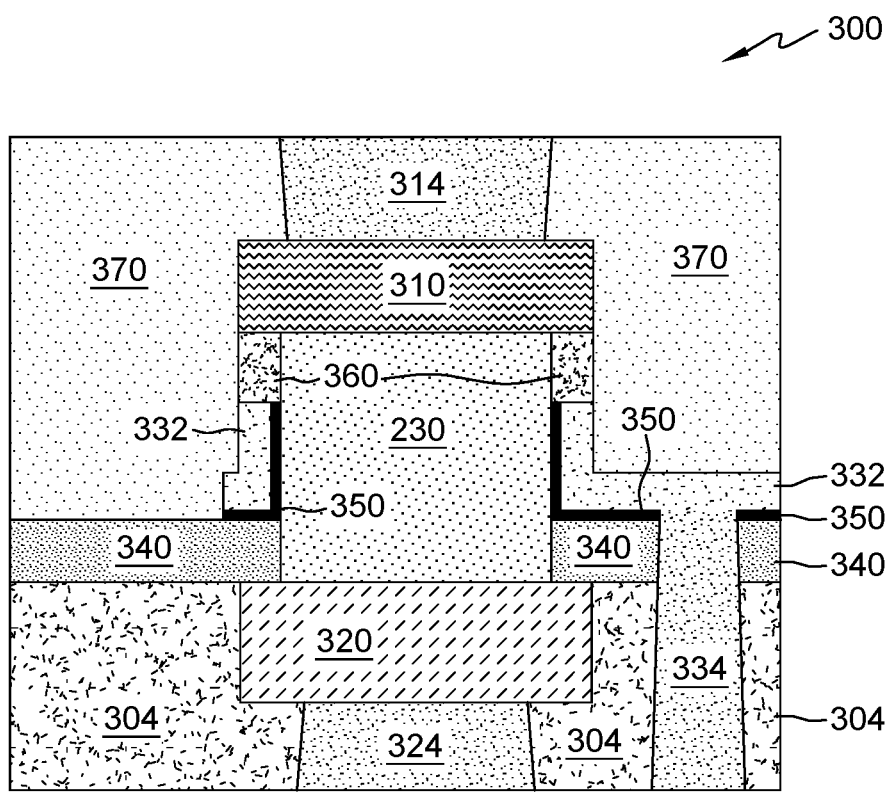
FIG. 3 depicts a cross-section view of a VTFET semiconductor structure with a frontside contact for the top source/drain and a backside contact for the bottom source/drain region and gate region, in accordance with a first embodiment of the present invention.

In a first embodiment, FIG. 1 shows a VTFET 100 with contact 114, contact 124, and contact 134 connected directly to interconnect wiring and/or a power delivery network (not shown) on the frontside of VTFET 100. In a second embodiment, FIG. 2 shows a VTFET 200 with contact 214 and contact 234 connected directly to interconnect wiring and/or a power delivery network (not shown) on the frontside of VTFET 200 and a contact 224 connected directly to interconnect wiring and/or a power delivery network (not shown) on the backside of VTFET 200. In a third embodiment, FIG. 3 shows a VTFET 300 with contact 314 connected directly to interconnect wiring and/or a power delivery network (not shown) on the frontside of VTFET 300 and contact 324 and contact 334 connected directly to interconnect wiring and/or a power delivery network (not shown) on the backside of VTFET 300.

FIG. 1 is a cross-sectional view of a VTFET 100 formed on a bulk substrate 102. The substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

VTFET 100 includes STI region 104 comprised of a dielectric material such as silicon oxide or silicon oxynitride, and is formed by methods known in the art. For example, in one illustrative embodiment, STI region 104 is a shallow trench isolation oxide layer.

VTFET 100 includes top source/drain region 110 and bottom source/drain region 120 on either end of fin 130. In an embodiment, top source/drain region 110 is formed between dielectric layer 170. In an embodiment, bottom source/drain region 120 is formed in substrate 102 between shallow trench isolation region 104. Top source/drain region 110 and bottom source/drain region 120 are formed by, for example, epitaxial growth processes. The epitaxially grown top source/drain region 110 and bottom source/drain region 120 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. According to an embodiment, the bottom source/drain region 120 can be boron doped SiGe for a p-type field-effect transistor (P-FET) or phosphorous doped silicon for an n-type field-effect transistor (N-FET). It is to be understood that the term "source/drain region" as used herein means that a given source/drain region can be either a source region or a drain region, depending on the application.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used. After epi formation, drive-in anneals can be applied to move the dopants closer to the bottom of the fin channels.

In an embodiment, as used herein, a "semiconductor fin" or fin 130 refers to a semiconductor material that includes a pair of vertical sidewalls that are parallel to each other. As used herein, a surface is "vertical" if there exists a vertical plane from which the surface does not deviate by more than three times the root mean square roughness of the surface. In an embodiment, each fin 130 has a height ranging from approximately 20 nm to approximately 200 nm, and a width ranging from approximately 5 nm to approximately 30 nm. Other heights and/or widths that are lesser than, or greater than, the ranges mentioned herein can also be used in the present application. Each fin 130 is spaced apart from its nearest neighboring fin 130 by a pitch ranging from approximately 20 nm to approximately 100 nm; the pitch is measured from one point, or reference surface, of one semiconductor fin to the exact same point, or reference surface, on a neighboring semiconductor fin. Also, the fins 130 are generally oriented parallel to each other. Although the present application describes and illustrates a single fin 108, any number of fins with gate region surrounding them may be used and the fins may be any shape.

The fin 130 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, fin 130 is silicon.

In an embodiment, bottom spacer layer 140 is formed on the STI region 104 and bottom source/drain region 120. In an embodiment, bottom spacer layer 140 is formed around fin 130. Suitable material for bottom spacer layer 140 includes, for example, silicon boron nitride (SiBN), silicon-borocarbonitride (SiBCN), silicon oxycarbonitride (SiOCN), SiN and SiOx. Bottom spacer layer 140 can be deposited using, for example, directional deposition techniques, such as a high-density plasma (HDP) deposition and gas cluster ion beam (GCIB) deposition. The directional deposition deposits the spacer material preferably on the exposed horizontal surfaces, but not on the lateral sidewalls. Alternatively, the bottom spacer layer 140 can be formed by overfilling the space with dielectric materials, followed by chemical mechanical planarization (CMP) and dielectric recess.

In an embodiment, top spacer layer 160 is formed on the gate region between fin 130 and dielectric layer 170. In an embodiment, top spacer layer 160 is formed around fin 130. Suitable material for top spacer layer 160 includes, for example, silicon boron nitride (SiBN), siliconborocarbonitride (SiBCN), silicon oxycarbonitride (SiOCN), SiN and SiOx. Bottom spacer layer 140 can be deposited using, for example, directional deposition techniques, such as a high-density plasma (HDP) deposition and gas cluster ion beam (GCIB) deposition. The directional deposition deposits the spacer material preferably on the exposed horizontal surfaces, but not on the lateral sidewalls. Alternatively, the top spacer layer 160 can be formed by overfilling the space with dielectric materials, followed by chemical mechanical planarization (CMP) and dielectric recess.

A gate region is formed on bottom spacer layer 140 and around fin 130. In illustrative embodiments, gate region is deposited on bottom spacer layer 140 and around fin 130 employing, for example, ALD, CVD, RFCVD, plasma enhanced CVD (PECVD), physical vapor deposition (PVD), or molecular layer deposition (MLD). The gate region may include a gate dielectric layer 150 and a gate conductor layer 132. The gate dielectric layer 150 may be formed of a high-k dielectric material. Examples of high-k materials include but are not limited to metal oxides such as $HfO_2$, hafnium silicon oxide (Hf—Si—O), hafnium silicon oxynitride (Hf-SiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate conductor layer 132 may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer 132 as desired.

In an embodiment, dielectric layer 170 may be composed of, for example, silicon oxide ($SiO_x$), undoped silicate glass (USG), fluorosilicate glass (FSG), borophosphosilicate glass (BPSG), a spin-on low-K dielectric layer, a chemical vapor deposition (CVD) low-K dielectric layer or any combination thereof. As indicated above, the term "low-K" as used herein refers to a material having a relative dielectric constant κ which is lower than that of silicon dioxide. In an embodiment, the dielectric layer 170 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

In an embodiment, top source/drain region 110, bottom source drain region 120 and gate region are connected to interconnect wiring and/or a power delivery network (not shown) through contact 114, contact 124, and contact 134, respectively. In an embodiment, as shown in FIG. 1, contact 114, contact 124, and contact 134 to are formed to directly connect to interconnect wiring and/or a power delivery network (not shown) on the frontside of the VTFET 100. In an embodiment, contact 114, contact 124, and contact 134 may include any suitable conductive material, such as, for example, copper, aluminum, tungsten, cobalt, or alloys thereof. Examples of deposition techniques that can be used include, for example, chemical vapor deposition (CVD), plasma enhanced chemical vapor deposition (PECVD), or atomic layer deposition (ALD). In some cases, an electroplating technique can be used to form contact 114, contact 124, and contact 134.

In a second embodiment, FIG. 2 shows a VTFET 200 with contact 214 and contact 234 connected directly to interconnect wiring and/or a power delivery network (not shown) on the frontside of VTFET 200 and a contact 224 connected directly to interconnect wiring and/or a power delivery network (not shown) on the backside of VTFET 200. In the second embodiment, VTFET 200 shares substantially similar features to the features described above in reference to VTFET 100. For example, top source/drain region 210 is substantially similar to top source/drain region 110. It should be noted, while a substrate, similar to substrate 102 shown in FIG. 1, is not shown in FIG. 2, it would be known to one skilled in the art that VTFET 200 would be formed on a substrate similar to substrate 102 shown in FIG. 1.

In the second embodiment, the orientation of contacts in VTFET 200 are the primary differences as compared to VTFET 100. In the second embodiment, contact 214 and contact 234 are connected directly to interconnect wiring and/or a power delivery network (not shown) on the frontside of VTFET 200 and a contact 224 connected directly to interconnect wiring and/or a power delivery network (not shown) on the backside of VTFET 200.

In a third embodiment, FIG. 3 shows a VTFET 300 with contact 314 connected directly to interconnect wiring and/or a power delivery network (not shown) on the frontside of VTFET 300 and contact 324 and contact 334 connected directly to interconnect wiring and/or a power delivery network (not shown) on the backside of VTFET 300. In the third embodiment, VTFET 300 shares substantially similar features to the features described above in reference to VTFET 100 and VTFET 200. For example, top source/drain region 310 is substantially similar to top source/drain region 110 and top source/drain region 210. It should be noted, while a substrate, similar to substrate 102 shown in FIG. 1, is not shown in FIG. 3, it would be known to one skilled in the art that VTFET 300 would be formed on a substrate similar to substrate 102 shown in FIG. 1.

In the third embodiment, the orientation of contacts in VTFET 300 are the are the primary differences as compared to VTFET 100 and VTFET 200. In the third embodiment, contact 314 is connected directly to interconnect wiring and/or a power delivery network (not shown) on the frontside of VTFET 300 and contact 324 and contact 334 are connected directly to interconnect wiring and/or a power delivery network (not shown) on the backside of VTFET 300.

FIG. 4A depicts a top view of the semiconductor structure 400A including four VTFET in parallel in accordance with a first embodiment of the present invention. In other words, a shared input is provided to the first VTFET, second VTFET, third VTFET, and fourth VTFET and a shared output extends from the first VTFET, second VTFET, third VTFET, and fourth VTFET. As shown in FIG. 4A, the first VTFET includes a shared bottom source/drain region 420A, a fin 430A, and a top source/drain region (not shown). As shown in FIG. 4A, the second VTFET includes a shared bottom source/drain region 420A, a fin 432A, and a top source/drain region (not shown). As shown in FIG. 4A, the third VTFET includes a shared bottom source/drain region 420A, a fin 434A, and a top source/drain region (not shown). As shown in FIG. 4A, the fourth VTFET includes a shared bottom source/drain region 420A, a fin 436A, and a top source/drain region (not shown). As described, the top source/drain region for each VTFET is not shown for simplicity of the drawings. It should be noted, in a preferred embodiment, the shared bottom source/drain region 420A may be connected to a backside power delivery network (not shown). In an alternative embodiment, the shared bottom source/drain region 420A may be connected to a frontside power delivery network (not shown). In an embodiment, shared bottom source/drain region 420A may be any number of separate bottom source/drain regions connected by a shared bottom contact which connects to a frontside or backside power delivery network (not shown). In an embodiment, the first VTFET, second VTFET, third VTFET, and fourth VTFET each have a top source/drain region (not shown) that is connected to a shared frontside contact 480A. In an embodiment, the shared frontside contact 480A is connected to a frontside or backside power delivery network (not shown). In an alternative embodiment, each top source/drain region (not shown) may be connected to a separate frontside contact (not shown) and each separate frontside contact is connected to a frontside or backside power delivery network (not shown). In an embodiment, as shown here, shared frontside contact 480A extends to a left edge of gate region 440A and a right edge of gate region 446A. In alternative embodiments, as known in the art, shared frontside contact 480A may extend any horizontal distance as long as shared frontside contact 480A is at least electrically connected to the top source/drain region(s), described below.

As shown in FIG. 4A, in an embodiment, the first VTFET includes a gate region 440A surrounding at least a portion of the fin 430A. In an embodiment, the second VTFET includes a gate region 442A surrounding at least a portion of the fin 432A. In an embodiment, semiconductor structure 400A includes a shared gate region 472 connected to both the gate region 440A and gate region 442A. In an embodiment, shared gate region 472 is connected to gate contact 474 and gate contact 474 is connected to shared gate contact 481. In an alternative embodiment, shared gate region 472 may not exist, and both gate region 440A and gate region 442A may have their own gate contact (not shown) that are connected to shared gate contact 481. In an embodiment, the third VTFET includes a gate region 444A surrounding at least a portion of the fin 434A. In an embodiment, the fourth VTFET includes a gate region 446A surrounding at least a portion of the fin 436A. In an embodiment, semiconductor structure 400A includes a shared gate region 476 connected to both the gate region 444A and gate region 446A. In an embodiment, shared gate region 476 is connected to gate contact 478 and gate contact 478 is connected to shared gate contact 481. In an alternative embodiment, shared gate region 476 may not exist, and both gate region 444A and gate region 446A may have their own gate contact (not shown) that are connected to shared gate contact 481. In another alternative embodiment, a single shared gate contact (not shown) may be connected to gate region 440A, 442A, 444A, and 446A and the single shared gate contact (not shown) is connected to shared gate contact 481. In an embodiment, gate contact 481 may be any size or shape in order to connect to gate regions 440A, 442A, 444A, and 446A and/or any configuration of shared gate regions. For example, shared gate contact 481 may only extend to the fourth VTFET and connect to a gate contact (not shown) adjacent to the fourth VTFET and the gate contact connects to gate region 440A, 442A, 444A, and 446A.

In an embodiment, shared gate contact 481 is connected to shared gate contact 483. It should be noted, for simplicity shared gate contact 481 and shared gate contact 483 are shown as two separate gate contacts, however, in embodiments they may be a single shared gate contact. In an embodiment, shared gate contact 483 extends to backside contact 482A. In an embodiment, backside contact 482A is connected to a backside power delivery network (not shown). In an embodiment, the center of backside contact 482A is approximately 1 CPP from the center of the adjacent fourth VTFET. In an embodiment, shared gate contact 481 may be any shape (i.e. length, width, height), as known in the art as long as shared gate contact 481 is electrically connected to the gate regions, discussed above.

FIG. 4B depicts a cross-sectional view of section A of the semiconductor structure 400B including four VTFET in parallel in accordance with a first embodiment of the present invention. As shown in FIG. 4B, the first VTFET includes a shared bottom source/drain region 420B, a fin 430B, a top source/drain region 410B, and a gate region 440B surrounding a portion of fin 430B. As shown in FIG. 4B, the second VTFET includes a shared bottom source/drain region 420B, a fin 432B, a top source/drain region 412B, and a gate region 442B surrounding a portion of fin 432B. As shown in FIG. 4B, the third VTFET includes a shared bottom source/drain region 420B, a fin 434B, a top source/drain region 414B, and a gate region 444B surrounding a portion of fin 434B. As shown in FIG. 4B, the fourth VTFET includes a shared bottom source/drain region 420B, a fin 436B, a top source/drain region 416B, and a gate region 446B surrounding a portion of fin 436B. It should be noted, in alternative embodiments, each VTFET, or any combination of VTFET, may have individual/separate bottom source/drain regions connected with a shared bottom contact (not shown). In an embodiment, the shared bottom source/drain region 420B is connected to backside contact 490 and backside contact 490 may be connected to a backside power delivery network (not shown). In an embodiment, backside contact 482B is connected, via structures not shown in cross-section A, to the gate regions 440B, 442B, 444B, and 446B. In an embodiment, backside contact 482B connects to a backside power delivery network (not shown). In an embodiment, shared gate contact 481 may connect to backside contact 482B at any vertical point of backside contact 482B. In an embodiment, if backside contact 482B is formed from a frontside, backside, or a combination of the two, backside contact 482B may connect to shared gate contact 481 at the middle, top, or any portion of backside contact 482B.

Figure 5A:
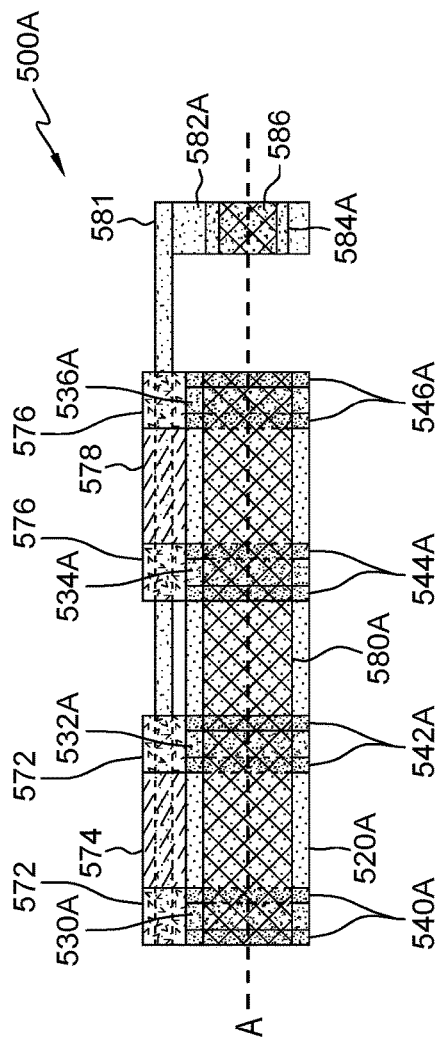
FIG. 5A depicts a top view of the semiconductor structure including four VTFET in parallel in accordance with a second embodiment of the present invention.

FIG. 5A depicts a top view of the semiconductor structure 500A including four VTFET in parallel in accordance with a second embodiment of the present invention. In other words, a shared input is provided to the first VTFET, second VTFET, third VTFET, and fourth VTFET and a shared output extends from the first VTFET, second VTFET, third VTFET, and fourth VTFET. As shown in FIG. 5A, the first VTFET includes a shared bottom source/drain region 520A, a fin 530A, and a top source/drain region (not shown). As shown in FIG. 5A, the second VTFET includes a shared bottom source/drain region 520A, a fin 532A, and a top source/drain region (not shown). As shown in FIG. 5A, the third VTFET includes a shared bottom source/drain region 520A, a fin 534A, and a top source/drain region (not shown). As shown in FIG. 5A, the fourth VTFET includes a shared bottom source/drain region 520A, a fin 536A, and a top source/drain region (not shown). As described, the top source/drain region for each VTFET is not shown for simplicity of the drawings. It should be noted, in a preferred embodiment, the shared bottom source/drain region 520A may be connected to a backside power delivery network (not shown). In an alternative embodiment, the shared bottom source/drain region 520A may be connected to a frontside power delivery network (not shown). In an embodiment, shared bottom source/drain region 420A may be any number of separate bottom source/drain regions connected by a shared bottom contact which connects to a frontside or backside power delivery network (not shown). In an embodiment, the first VTFET, second VTFET, third VTFET, and fourth VTFET each have a top source/drain region (not shown) that is connected to a shared frontside contact 580A. In an embodiment, the shared frontside contact 480A is connected to a frontside or backside power delivery network (not shown). In an alternative embodiment, each top source/drain region (not shown) may be connected to a separate frontside contact (not shown) and each separate frontside contact is connected to a frontside or backside power delivery network (not shown). In an embodiment, as shown here, shared frontside contact 580A extends to a left edge of gate region 540A and right edge of gate region 546A. In alternative embodiments, as known in the art, shared frontside contact \580A may extend any horizontal distance as long as shared frontside contact 580A is at least electrically connected to the top source/drain region(s), described below.

As shown in FIG. 5A, in an embodiment, the first VTFET includes a gate region 540A surrounding at least a portion of the fin 530A. In an embodiment, the second VTFET includes a gate region 542A surrounding at least a portion of the fin 532A. In an embodiment, semiconductor structure 500A includes a shared gate region 572 connected to both the gate region 540A and gate region 542A. In an embodiment, shared gate region 572 is connected to gate contact 574 and gate contact 574 is connected to shared gate contact 581. In an alternative embodiment, shared gate region 572 may not exist, and both gate region 540A and gate region 542A may have their own gate contact (not shown) that are connected to shared gate contact 581. In an embodiment, the third VTFET includes a gate region 544A surrounding at least a portion of the fin 534A. In an embodiment, the fourth VTFET includes a gate region 546A surrounding at least a portion of the fin 536A. In an embodiment, semiconductor structure 500A includes a shared gate region 576 connected to both the gate region 544A and gate region 546A. In an embodiment, shared gate region 576 is connected to gate contact 578 and gate contact 578 is connected to shared gate contact 581. In an alternative embodiment, shared gate region 576 may not exist, and both gate region 544A and gate region 546A may have their own gate contact (not shown) that are connected to shared gate contact 581. In another alternative embodiment, a single shared gate contact (not shown) may be connected to gate region 540A, 542A, 544A, and 546A and the single shared gate contact (not shown) is connected to shared gate contact 581. In an embodiment, gate contact 581 may be any size or shape in order to connect to gate regions 540A, 542A, 544A, and 546A and/or any configuration of shared gate regions. For example, shared gate contact 581 may only extend to the fourth VTFET and connect to a gate contact (not shown) adjacent to the fourth VTFET and the gate contact connects to gate region 540A, 542A, 544A, and 546A.

In an embodiment, shared gate contact 581 is connected to shared gate contact 582A. It should be noted, for simplicity shared gate contact 581 and shared gate contact 582A are shown as two separate gate contacts, however, in embodiments they may be a single shared gate contact. In an embodiment, shared gate contact 582A extends to RX layer 584A. In an embodiment, RX layer 584A may extend to connect to any other semiconductor devices (not shown). In an embodiment, RX layer 584A connects to backside contact 586. In an embodiment, backside contact 586 is connected to a backside power delivery network (not shown). In an embodiment, the center of shared gate contact 582A is approximately 1 CPP from the center of the adjacent fourth VTFET. In an embodiment, shared gate contact 581 may be any shape (i.e. length, width, height), as known in the art as long as shared gate contact 581 is electrically connected to the gate regions, discussed above.

Figure 5B:
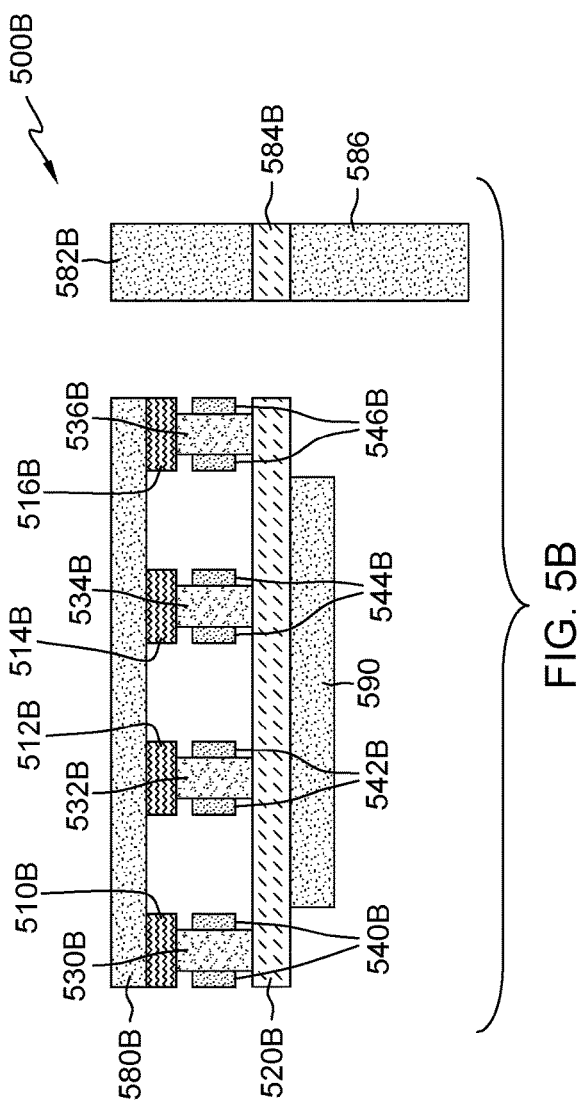
FIG. 5B depicts a cross-sectional view of section B of the semiconductor structure including four VTFET in parallel in accordance with a second embodiment of the present invention.

FIG. 5B depicts a cross-sectional view of section B of the semiconductor structure 500B including four VTFET in parallel in accordance with a second embodiment of the present invention. As shown in FIG. 5B, the first VTFET includes a shared bottom source/drain region 520B, a fin 530B, a top source/drain region 510B, and a gate region 540B surrounding a portion of fin 530B. As shown in FIG. 5B, the second VTFET includes a shared bottom source/drain region 520B, a fin 532B, a top source/drain region 512B, and a gate region 542B surrounding a portion of fin 532B. As shown in FIG. 5B, the third VTFET includes a shared bottom source/drain region 520B, a fin 534B, a top source/drain region 514B, and a gate region 544B surrounding a portion of fin 534B. As shown in FIG. 5B, the fourth VTFET includes a shared bottom source/drain region 520B, a fin 536B, a top source/drain region 516B, and a gate region 546B surrounding a portion of fin 536B. It should be noted, in alternative embodiments, each VTFET, or any combination of VTFET, may have individual/separate bottom source/drain regions connected with a shared bottom contact (not shown). In an embodiment, the shared bottom source/drain region 520B is connected to backside contact 590 and backside contact 590 may be connected to a backside power delivery network (not shown). In an embodiment, backside contact 582B is connected, via structures not shown in cross-section B, to the gate regions 540B, 542B, 544B, and 546B. In an embodiment, backside contact 482B connects to a RX layer 584B. As discussed above, in an embodiment, RX layer 584A may extend to connect to any other semiconductor devices (not shown). In an embodiment, RX layer 584A connects to backside contact 586. In an embodiment, backside contact 586 is connected to a backside power delivery network (not shown). In an embodiment, shared gate contact 581 may connect to backside contact 582B at any vertical point of backside contact 582B. In an embodiment, if backside contact 582B is formed from a frontside, backside, or a combination of the two, backside contact 582B may connect to shared gate contact 581 at the middle, top, or any portion of backside contact 582B.

Figure 6:
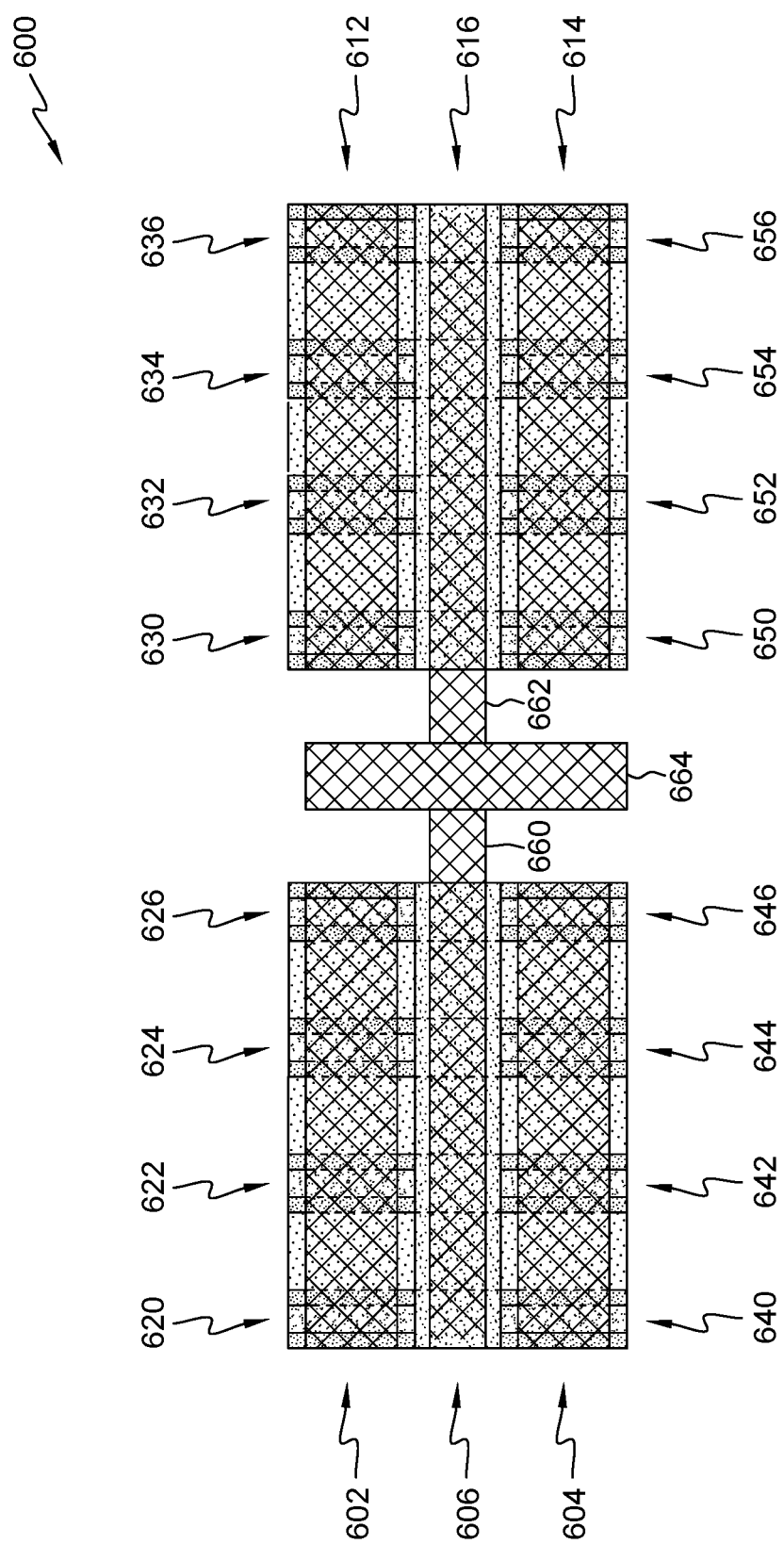
FIG. 6 depicts a top view of the semiconductor structure with a shared gate region for multiple rows of semiconductor structures in accordance with an embodiment of the present invention.

FIG. 6 depicts a top view of the semiconductor structure with a shared gate region for multiple rows of semiconductor structures in accordance with an embodiment of the present invention. As shown in FIG. 6, in an embodiment, semiconductor structure 600 includes a first row 602 of VTFET 620, 622, 624, and 626 in parallel. In an embodiment, semiconductor structure 600 includes a second row 612 of VTFET 630, 632, 634, and 636 in parallel. In an embodiment, semiconductor structure 600 includes a third row 604 of VTFET 640, 642, 644, and 646 in parallel. In an embodiment, semiconductor structure 600 includes a fourth row 614 of VTFET 650, 652, 654, and 656 in parallel. In other words, each group of four VTFET in parallel include a shared input (source/drain region or contact region) and shared output (source/drain region or contact region). VTFET 620, 622, 624, 626, 630, 632, 634, 636, 640, 642, 644, 646, 650, 652, 654, and 656 are similar to VTFET structures described herein and include similar features. It should be noted, as stated above, semiconductor structure 600 represents a single structure and layout of VTFET circuitry and does not limit embodiments of the present invention to this structure and layout. In an embodiment, any other structure and layout of VTFET circuitry, including but not limited to other field-effect-transistors, may be included although not shown. It should be noted, for ease in discussion of FIG. 6, source/drain region contacts have not been included.

In an embodiment, the first row 602 of VTFET and third row 604 of VTFET include a first gate region 606. In an embodiment, the third row 612 of VTFET and fourth row 614 of VTFET include a second gate region 616. In an embodiment, the first gate region 606 includes a first gate contact 660. In an embodiment, the first gate contact 660 is connected to gate regions of each VTFET found in the first row 602 and third row 604. In an embodiment, the second gate region 616 includes a second gate contact 662. In an embodiment, the second gate contact 662 is connected to gate regions of each VTFET found in the second row 612 and fourth row 614. In an embodiment, the first gate contact 660 and second gate contact 662 are connected to shared gate contact 664. In an embodiment, shared gate contact 664 includes one or more backside gate contacts (not shown) connected to a backside power delivery network (not shown). In an embodiment, the center of shared gate contact 664 is 1 CPP distance from the center of fins of VTFET 626, 630, 646, and 650.

In an embodiment, as described above, a frontside contact may extend any horizontal distance as long as the frontside is at least electrically connected to the top source/drain region(s), described above.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a vertical-transport field-effect transistor (VTFET) on a wafer;
   a backside power delivery network on a backside of the wafer; and
   a first backside contact connected to a gate of the VTFET and a first portion of the backside power delivery network, wherein the first backside contact delivers signals from the first portion of the backside power delivery network to the gate of the VTFET.

2. The semiconductor device of claim 1, further comprising:
   wherein the VTFET has a first width, and wherein the first width is a contacted poly pitch (CPP); and
   wherein the first backside contact is at least the first width from the VTFET.

3. The semiconductor device of claim 1, further comprising:
   wherein the VTFET has a first width, and wherein the first width is a contacted poly pitch (CPP); and
   wherein the first backside contact is double the first width from the VTFET.

4. The semiconductor device of claim 1, wherein the signals delivered from the first portion of the backside power delivery network to the gate of the VTFET through the first backside contact are selected from the group consisting of a clock signal, a bus signal, and an input/output (I/O) signal.

5. The semiconductor device of claim 1, wherein a height of the first backside contact is a cell height of the VTFET.

6. The semiconductor device of claim 1, further comprising:
   a frontside contact, wherein the frontside contact is connected to a top source/drain region of the VTFET and a frontside wiring.

7. The semiconductor device of claim 6, wherein the frontside wiring is selected from the group consisting of local clock signal and an external input signal.

8. A semiconductor device comprising:
   a plurality of vertical-transport field-effect transistor (VTFET) on a wafer;
   a backside power delivery network on a backside of the wafer; and
   a first backside contact connected to a gate of each VTFET of the plurality of VTFET and a first portion of the backside power delivery network, wherein the first backside contact delivers signals from the first portion of the backside power delivery network to the gate of each VTFET of the plurality of VFETS.

9. The semiconductor device of claim 8, further comprising:
   wherein each VTFET of the plurality of VTFET has a first width, and wherein the first width is a contacted poly pitch (CPP); and
   wherein the first backside contact is at least the first width from a first VTFET of the plurality of VTFET.

10. The semiconductor device of claim 8, further comprising:
    wherein VTFET of the plurality of VTFET has a first width, and wherein the first width is a contacted poly pitch (CPP); and
    wherein the first backside contact is double the first width from a first VTFET of the plurality of VTFET.

11. The semiconductor device of claim 8, wherein the signals delivered from the first portion of the backside power delivery network to the gate of each VTFET of the plurality of VTFET through the first backside contact are selected from the group consisting of a clock signal, a bus signal, and an input/output (I/O) signal.

12. The semiconductor device of claim 8, wherein a height of the first backside contact is a cell height of a VTFET of the plurality of VTFET.

13. The semiconductor device of claim 8, further comprising:
a frontside contact, wherein the frontside contact is connected to a top source/drain region of the plurality of VTFET and a frontside wiring.

14. The semiconductor device of claim 8, wherein the frontside wiring is selected from the group consisting of local clock signal and an external input signal.

15. A semiconductor device comprising:
a first plurality of vertical-transport field-effect transistor (VTFET) in a first row on a wafer;
a second plurality of VTFET in a second row on the wafer, wherein the first row is vertically adjacent to the second row;
a backside power delivery network on a backside of the wafer;
a first backside contact between the first row and the second row, wherein the first backside contact is connected to a gate of each VTFET of the first plurality of VTFET and a gate of each VTFET of the second plurality of VTFET; and
a second backside contact connected to the first backside contact and a first portion of the backside power delivery network, wherein the first and second backside contacts deliver signals from the first portion of the backside power delivery network to the gate of each VTFET of the first and second plurality of VTFET.

16. The semiconductor device of claim 15, further comprising:
wherein at least one VTFET of the first plurality of VTFET and second plurality of VTFET has a first width, and wherein the first width is a contacted poly pitch (CPP).

17. The semiconductor device of claim 16, further comprising:
a third plurality of VTFET in the first row, wherein between the first plurality of VTFET and the third plurality of VTFET is at least the first width; and
wherein the first backside contact extends adjacent to the third plurality of VTFET, and wherein the first backside contact is connected to a gate of each VTFET of the third plurality of VTFET.

18. The semiconductor device of claim 17, further comprising:
a fourth plurality of VTFET in the second row, wherein between the second plurality of VTFET and the fourth plurality of VTFET is at least the first width; and
wherein the first backside contact extends adjacent to the fourth plurality of VTFET, and wherein the first backside contact is connected to a gate of each VTFET of the fourth plurality of VTFET.

19. The semiconductor device of claim 15, wherein a height of the second backside contact is a height of a VTFET cell of the first plurality of VTFET and second plurality of VTFET.

20. The semiconductor device of claim 15, wherein the signals delivered from the first portion of the backside power delivery network to the gate of each VTFET of the first and second plurality of VTFET through the first and second backside contacts are selected from the group consisting of a clock signal, a bus signal, and an input/output (I/O) signal.

* * * * *